United States Patent [19]

Alappat et al.

[11] Patent Number: 5,387,896
[45] Date of Patent: Feb. 7, 1995

[54] RASTERSCAN DISPLAY WITH ADAPTIVE DECAY

[75] Inventors: Kuriappan P. Alappat; Edward E. Averill, both of Beaverton, Oreg.

[73] Assignee: Tektronix, Inc., Wilsonville, Oreg.

[21] Appl. No.: 563,656

[22] Filed: Aug. 6, 1990

[51] Int. Cl.$^6$ .......................... G09G 1/16; H04N 5/66
[52] U.S. Cl. ................................ 345/147; 345/200; 348/805
[58] Field of Search ................ 342/176, 185, 195; 324/88, 121 R; 340/721, 722, 723, 744, 747, 793, 799; 345/133, 134, 185, 200, 203, 147

[56] References Cited

U.S. PATENT DOCUMENTS

| | | | |
|---|---|---|---|
| 4,165,506 | 8/1979 | Brands et al. | 340/721 |
| 4,223,353 | 9/1980 | Keller et al. | 340/793 |
| 4,504,827 | 3/1985 | Hanson et al. | 340/744 |
| 4,829,293 | 5/1989 | Schlater | 340/747 |
| 4,940,931 | 7/1990 | Katayama et al. | 324/121 R |

Primary Examiner—Alvin E. Oberley
Assistant Examiner—Steve Saras
Attorney, Agent, or Firm—John Smith-Hall; Francis I. Gray; Boulden G. Griffith

[57] ABSTRACT

Apparatus for manipulating numerical values stored in a memory comprises a modify device for receiving numerical values from the memory and returning numerical values to the memory. The modify device has at least a first state in which it modifies a numerical value received from the memory in a predetermined fashion before returning the numerical value to the memory and a second state in which it does not modify a numerical value received from the memory in the predetermined fashion before returning the numerical value to the memory. The apparatus also comprises a characterizing device for examining at least some of the numerical values and calculating at least one number that defines a property of the examined numerical values. The characterizing device is connected to the modify device for placing the modify device in the first state or the second state depending on the value of the calculated number.

3 Claims, 1 Drawing Sheet

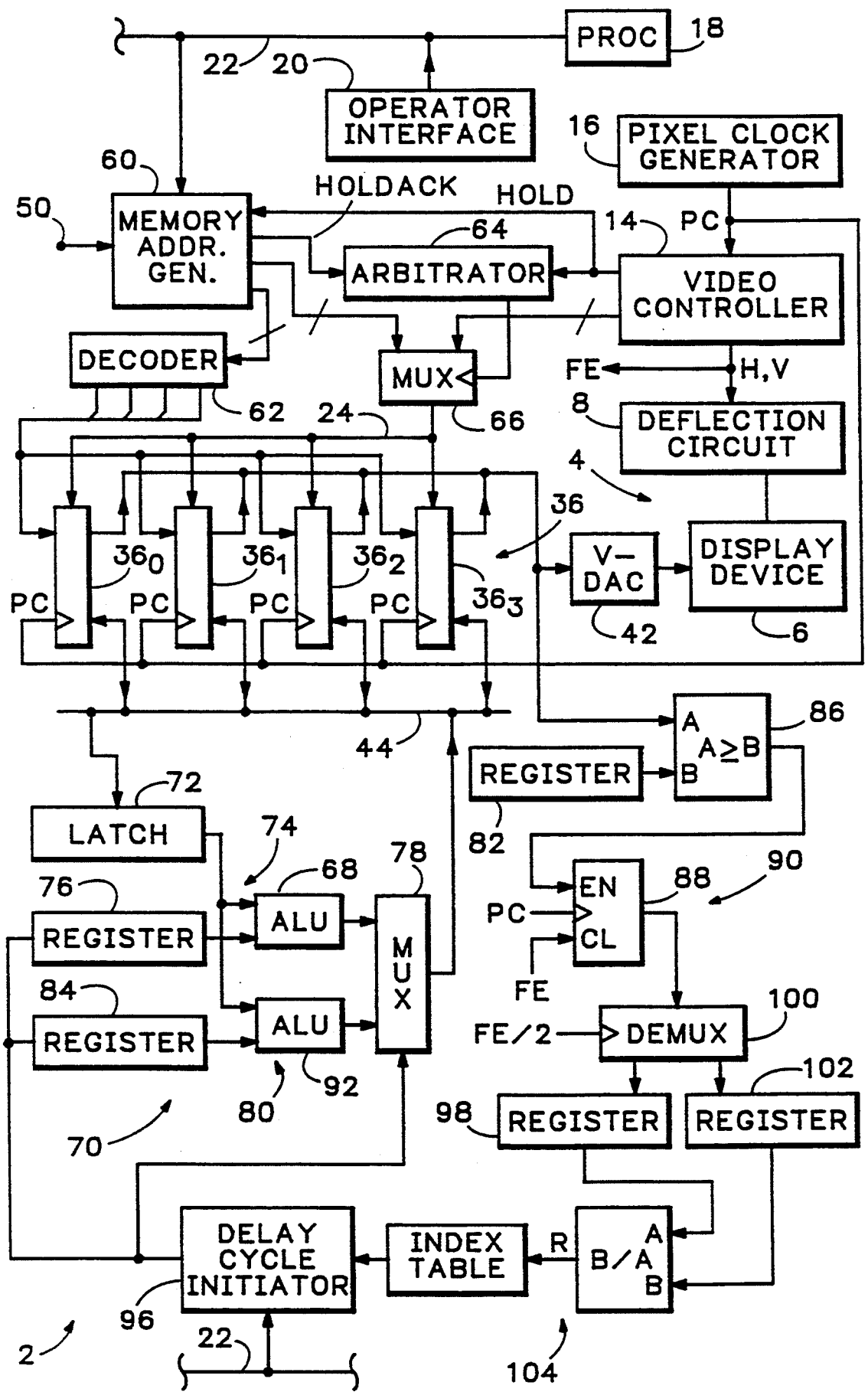

RASTERSCAN DISPLAY WITH ADAPTIVE DECAY

BACKGROUND OF THE INVENTION

This invention relates to apparatus for providing a rasterscan display representative of change of a first variable as a function of a second variable.

An oscilloscope is conventionally used to display a waveform representative of change of a first variable as a function of a second variable. It will be convenient in the following description to assume from time to time that the first variable is the magnitude of a measured quantity and that the second variable is time, so that the waveform represents magnitude of the measured quantity as a function of time, but it will be understood that the second variable need not be time or even related to time.

In a conventional analog oscilloscope, an electron beam repetitively sweeps horizontally across a cathode ray tube (CRT) screen creating a trace of glowing phosphor on the screen. When the magnitude of an input signal controls the vertical position of the beam during its horizontal sweep across the screen, the trace represents the behavior of the input signal as a function of time. A trace produced by a single beam sweep eventually fades out, but when the input signal is periodic and the beam sweeps are periodically initiated at similar points during successive cycles of the input signal, the beam traces out the same path during each sweep and a stable waveform is continually displayed.

The behavior of the input signal might not be precisely the same during each sweep cycle. When the screen phosphors are persistent enough to glow substantially longer than a single sweep cycle, the waveform display represents a time-weighted record of traces produced by several previous sweeps of the beam and conveys information regarding the behavior of the input signal during more than just the most recent sweep cycle.

In an analog oscilloscope, the time taken to complete a horizontal sweep is constant, and therefore the intensity of the trace depends on the length of the trace. The length of the trace depends on the frequency of the input signal, and therefore the intensity of the trace provides valuable information concerning the frequency of the input signal.

An operator might adjust the beam intensity so that a screen phosphor particle becomes brighter each time the beam strikes it, and then becomes dimmer until it is struck again. This persistence mode of operation helps reduce effects of transient noise on the waveform display inasmuch as vertical excursions of the beam due to transient noise produce only dim traces that quickly fade away, whereas the display of the underlying stable waveform remains bright.

In a vector digital oscilloscope the electron beam traces out vectors having their end points at discrete screen locations organized as an array of horizontal rows and vertical columns. In the event that the oscilloscope is used to display variation of signal magnitude as a function of time, each column represents a different sampling time interval and each row represents a different signal magnitude. Typically, an input signal is sampled and digitized and a succession of pairs of digital words is generated, one word of each pair representing the magnitude of the input signal and the other word representing sample time following a trigger event. The magnitude value of each pair is written into an acquisition memory at a location that depends on the associated time value, to form a waveform record. When a single acquisition is complete the contents of the acquisition memory can be used to create a stable display on the CRT screen.

A known rasterscan digital oscilloscope has a display memory in which the number of addressable memory locations is equal to the number of displayable pixels of the display screen. The address of each memory location has two components, one depending on the magnitude of a sample and the other on the time at which the sample was taken. The two components of the memory address correspond respectively to the X and Y components of the pixel address on the CRT screen. A display is formed on the CRT screen by scanning all the pixels in accordance with a raster pattern and illuminating the pixels selectively, depending on the contents of the corresponding memory locations. If each memory location is capable of storing a single bit of data, the beam is turned on if the value of the bit is logical 1 and is held off if the value is logical 0.

If each memory location is able to store more than a single bit of data, each pixel can be illuminated with multiple gray scale levels. For example, each memory location might be able to store four bits, representing off and 15 gray scale levels. In use of an oscilloscope having such a memory, the content of a memory location is read from the memory when a sample pair having the same combination of magnitude and time components is received, and the value stored in the memory is progressively increased to a maximum of decimal 15. Moreover, from time to time the content of each memory location is read and is progressively decreased to a minimum of 0. In this manner, it is possible to increase the information content of the display and emulate the persistence feature of an analog oscilloscope.

U.S. Pat. No. 4,223,353 (Keller) discloses a digital rasterscan display device in which the decay can be controlled to be a function of time only or a function of both time and rate of accumulation of data. If the accumulation rate is low, the operator may change over to the time-based decay.

In the case of a single-valued signal, i.e. a signal of which the magnitude component is the same on each acquisition for a given time component, the information content in a display of the signal waveform is built up very quickly and it takes only a few acquisitions for the pixels that are illuminated to reach full intensity. On the other hand, other signals, such as a TV line signal, may have different magnitudes at a given time in successive acquisitions and therefore it can take several acquisitions to build up information content. It is clear therefore that a decay rate based on acquisition rate or time only will not provide a display with optimum information content.

SUMMARY OF THE INVENTION

In accordance with a first aspect of the invention, apparatus for manipulating numerical values stored in a memory comprises modify means for receiving numerical values from the memory and returning numerical values to the memory. The modify means have at least a first state in which they modify a numerical value received from the memory in a predetermined fashion before returning the numerical value to the memory, and a second state in which they do not modify a numerical value received from the memory in said predetermined fashion before returning the numerical value to the memory. The apparatus also comprises characterizing means for examining at least some of the numerical values and calculating at least one number that defines a property of the examined numerical values. The characterizing means are connected to the modify means for placing the modify means in the first state or the second state depending on the value of said number.

In accordance with a second aspect of the invention, a method of operating apparatus for receiving data representing events defined by respective pairs of first and second variables comprises the steps of storing numerical values representative of the number of occurrences of each event, examining at least some of the stored numerical values and calculating at least one number that defines a property of the examined numerical values, modifying the stored numerical values in a fashion that depends on the calculated number, and employing the modified numerical values to provide a graphic display of the function that relates the first and second variables.

BRIEF DESCRIPTION OF THE DRAWING

For a better understanding of the invention, and to show how the same may be carried into effect, reference will now be made by way of example, to the accompanying drawing, the single FIGURE of which is a schematic block diagram of a rasterscan digital oscilloscope embodying the present invention.

In order to avoid cluttering the drawing, components that are not helpful in understanding the invention have not been illustrated.

DETAILED DESCRIPTION

The illustrated oscilloscope 2 comprises a CRT display device 4 having a display screen 6 and a deflection circuit 8. Oscilloscope 2 operates under control of a processor 18, which causes the oscilloscope to execute various operations. Processor 18 communicates with other components of the oscilloscope over a system bus 22. An operator of the oscilloscope is able to adjust various settings of the oscilloscope through an operator interface 20. Oscilloscope 2 also comprises a video controller 14 that operates in response to a pixel clock signal PC generated by a pixel clock generator 16 and generates horizontal and vertical sync pulses H and V. Video controller 14 also generates a frame end signal FE synchronously with the vertical sync pulse V.

The sync pulses are applied to deflection circuit 8, which generates horizontal and vertical deflection signals that cause the electron beam of the CRT to be deflected over the screen of the CRT in a horizontal raster pattern composed of 512 lines. During each horizontal line time, 512 pixel clock pulses are generated. In this manner, the display screen is divided into 262,144 displayable pixels.

Oscilloscope 2 also comprises a dual-ported buffer memory 36 having 262,144 addressable memory locations. Memory 36 is composed of four segments $36_0$, $36_1$, $36_2$ and $36_3$ each organized as 512 rows containing 128 locations, and each memory location is able to store a four-bit numerical value. Memory 36 has a parallel port connected to a data bus 44 and a serial port connected to a video digital-to-analog converter (V-DAC) 42.

At the beginning of each horizontal scanline retrace, video controller 14 initiates a display refresh cycle. During this cycle, the video controller applies a HOLD signal to a memory address generator 60 and to an address bus arbitrator 64. Arbitrator 64 controls the state of an address bus multiplexer 66, which has one state in which it selects video controller 14 and another state in which it selects memory address generator 60. Memory address generator 60 acknowledges the HOLD signal by issuing a HOLDACK signal to bus arbitrator 64. Arbitrator 64 responds to the HOLD and HOLDACK signals by placing multiplexer 66 in the state in which it selects video controller 14. Video controller 14 places an eight-bit row address, corresponding to the next scanline to be displayed, on address bus 24. In this fashion, one row of memory locations in each segment of memory 36 is selected. The contents of the 128 memory locations in the selected row of each segment are shifted to an internal shift register of the memory segment. Memory segments $36_0$, $36_1$, $36_2$ and $36_3$ are selected in repetitive sequence in response to successive pixel clock pulses during the active interval of the horizontal scanline, and as each segment is selected the contents of its internal shift register are shifted out through the serial port. Thus, the values shifted through the serial port are in the sequence $36_0$, $36_1$, $36_2$, $36_3$, $36_0$, $36_1$ and so on, and are synchronized with deflection of the electron beam under control of the deflection signals generated by deflection circuit 8. The sequence of numerical values read out from memory 36 is converted into an analog intensity signal by V-DAC 42. The intensity signal is used to control the intensities with which the pixels on one line of the raster are illuminated. Thus, the addressable memory locations of buffer memory 36 map on a one-to-one basis to displayable pixels on CRT screen 6 and are scanned synchronously with the scanning of display screen 6 by the electron beam of display device 4. The intensity with which a given pixel is illuminated in the display refresh cycle depends on the numerical value stored in the corresponding memory location. Since the numerical values stored in buffer memory 36 each have four bits, display device 4 is able to display 16 intensity levels (off and 15 gray levels).

Oscilloscope 2 has an input 50 at which it receives waveform data, comprising pairs of digital words. One word of each pair represents the value of a first parameter and the other word of the pair represents the value of a second parameter. The waveform data pairs are applied to memory address generator 60. In response to each waveform data pair, and scale and offset signals received from operator interface 20, memory address generator 60 generates a nine-bit Y address word and a nine-bit X address word. If video controller 14 requires access to bus 24, memory address generator 60 temporarily stores the X and Y address words. When display refresh cycles are not taking place, so that video controller 14 does not require access to bus 24, arbitrator 64 places multiplexer 66 in the state in which it selects memory address generator 60, and memory address generator 60 applies the Y address word and the upper seven bits of the X address word to multiplexed address bus 24 as a 16-bit memory address vector. Address bus 24 is eight bits wide, and therefore the memory address vector is supplied in two words of eight bits each, one word being composed of the upper eight bits of the Y address and the other of the X address and the LSB of the Y address. Memory address generator 60 applies the two LSBs of the X address word to a decoder 62, which provides an output that selects one of the four memory segments.

During a signal acquisition, buffer memory 36 operates in a read, modify, write mode. The values stored at the four memory locations, identified by a memory address vector applied to bus 24 by memory address generator 60, are read from the buffer memory and are placed on the data bus 44. A pixel manipulator 70 reads the values from the data bus and loads them into a latch 72, which applies the values as inputs to an incrementer 74. In the case of the illustrated embodiment of the invention, incrementer 74 comprises an arithmetic logic unit (ALU) 68 and a register 76. Incrementer 74 provides four output values, representative of the sum of the content of register 76 with the four input values respectively, and these modified values are placed on the data bus by a multiplexer 78. On the basis of the two LSBs of the X address word generated by memory address generator 60, decoder 62 applies a write enable signal to one of the four segments of memory 36, and the appropriate one of the four modified values is written back into the appropriate segment of the buffer memory 36. The contents of the corresponding memory locations in the other three segments of memory 36 remain unchanged.

Pixel manipulator 70 also comprises a decrementer 80, which enables oscilloscope 2 to emulate the persistence mode of operation of an analog oscilloscope. When emulating the persistence mode, oscilloscope 2 from time to time executes a decay cycle in response to a signal provided by a decay cycle initiator 96. During a decay step, memory address generator 60 generates a memory address vector internally and the contents of the four memory locations identified by that memory address vector are applied through latch 72 to decrementer 80. In the case of the illustrated embodiment of the invention, decrementer 80 comprises a register 84 and an arithmetic logic unit 92. Decrementer 80 provides four output values, representative of the four input values minus the content of register 84. The output values provided by the decrementer are placed on the data bus by multiplexer 78 and are written back into the appropriate memory locations of memory 36. After each read, modify, write cycle, memory address generator 60 generates a new memory address vector. In order to reduce intensity pumping effects, the memory address vectors generated in successive decay steps point to locations that are staggered over the address space of memory 36. In a decay cycle, which constitutes a succession of decay steps, all memory locations containing non-zero data values are decremented.

The values that are loaded into registers 76 and 84 are determined by an index generator 104, which operates in response to a display characterizing circuit 90. Display characterizing circuit 90 executes a display characterizing cycle during two successive frames of the raster defined by video controller 14. Circuit 90 comprises a register 82 which is loaded with the number one during the first frame of a display characterizing cycle and is loaded with the number 15 during the second frame of a display characterizing cycle. Register 82 provides this number to one input of a comparator 86, the other input of which is connected to the serial port of memory 36. Comparator 86 provides a logical one output if the number received from memory 36 is greater than or equal to the number loaded into register 82, and otherwise provides a logical zero output. The output of comparator 86 is connected to the enable input of a counter 88. During a display characterizing cycle, counter 88 receives the pixel clock at its clock input and the frame end signal at its clear input. Thus, at the beginning of each frame, a zero count is stored in counter 88, and during the frame the counter accumulates a count of the number of pixels that are illuminated at a gray level at least as great as that represented by the number loaded into register 82. The output of counter 88 is connected to a demultiplexer 100, which applies the count accumulated in counter 88 to a register 98 at the end of the first frame of a display characterizing cycle and to a register 102 at the end of the second frame of the display characterizing cycle. At the end of the display characterizing cycle, the contents of registers 98 and 102 are delivered to the index generator 104.

Index generator 104 divides the content of register 102 by the content of register 98 to return the ratio R of the number of saturated pixels to the number of illuminated pixels. The ratio R is applied to an index table, which generates an index value representing an increment/decrement rule and applies this index to decay cycle initiator 96. Decay cycle initiator 96 responds to different values of the index by controlling the increment/decrement circuit in accordance with the following table:

| Index | Decay Rate | Intensity Increment | Intensity Decrement |
|---|---|---|---|
| 1 | Fast | 1 | 3 |
| 2 | Medium | 1 | 3 |
| 3 | Slow | 1 | 3 |
| 4 | Fast | 1 | 2 |
| 5 | Medium | 1 | 2 |
| 6 | Slow | 1 | 2 |
| 7 | Fast | 1 | 1 |
| 8 | Medium | 1 | 1 |
| 9 | Slow | 1 | 1 |
| 10 | Fast | 2 | 1 |
| 11 | Medium | 2 | 1 |
| 12 | Slow | 2 | 1 |
| 13 | Fast | 3 | 1 |
| 14 | Medium | 3 | 1 |
| 15 | Slow | 3 | 1 |

The fast decay rate is generally based on system limitations, and might be, for example, one decay cycle per frame. The slow decay rate would typically be dependent on an acceptable response time and might be one decay cycle every fifth frame. The intensity increment and intensity decrement are the values loaded into registers 76 and 84 respectively.

If, for example, the index value is 8, decay cycles are executed at the medium rate, on each decay cycle the values stored in memory 36 are decremented by one, and each time a particular memory address vector is provided by memory address generator 60 the value stored at the corresponding memory location is incremented by one.

The optimum value of R is predetermined, based on a balancing of the desirability of employing the entire dynamic range of intensities against the desirability of emphasizing sufficiently pixels that represent frequently occurring events. The optimum value of R might be, for example, 0.2.

If the current index is 11, this corresponds to a medium decay rate, say one decay cycle every third frame, an increment value of 2 and a decrement value of 1. If the frame rate is 60 Hz, corresponding to a period of 16.7 ms, at 33.4 ms intervals the value of R is determined. If R is less than 0.2, the index value is increased by one, to 12, corresponding to a slow decay rate, an increment value of 2 and a decrement value of 1. Since decay cycles then occur less frequently, the value of R should increase. If, on the other hand, R is more than 0.2, the index value is decreased by one, to 10. The decay cycles then occur more frequently and R should decrease. For values of the index less than 7, the value loaded into register 84 is greater than one, in order to increase the rate at which illuminated pixels fade.

In all cases, decay cycle initiator 96 initiates a decay cycle after a predetermined time has elapsed following the previous decay cycle.

It will be appreciated that the invention is not restricted to the particular embodiment that has been described, and that variations may be made therein without departing from the scope of the invention as defined in the appended claims and equivalents thereof. For example, characterizing circuit 90 might be operative only for a selected range within the X address space of buffer memory 36, in which case characterizing circuit 90 provides an indication as to whether the display characteristic applies to the portion of the display that is within the window defined by the range of values of X. Incrementer 74 and decrementer 80 need not be implemented by arithmetic logic units that carry out addition and subtraction operations, but one or both might constitute a multiplier that multiplies the input value by a number whose value depends on the index value, or a RAM or ROM look-up table containing data values that depend on the index value. Use of a look-up table allows for non-linear increase or decrease of data values. Further, the index table that provides the index value to decay cycle initiator 96 is not fixed. For example, if a particular application requires fast responsiveness, the index table may be set to generate only index values that correspond to fast decay rates. Moreover, the topology of counter 88, for counting the number of saturated pixels and the number of illuminated pixels, is not critical. For example, instead of register 82 and comparator 86, counter 88 might employ combinational logic units for detecting saturated pixels and illuminated pixels. It is not essential that the number of memory locations be equal to the number of displayable pixels, so long as there are at least as many memory locations as displayable pixels. Although the invention has been described above in connection with a hardware implementation, many of the functions may be implemented in software.

We claim:

1. Apparatus for manipulating numerical values stored in a memory, said apparatus comprising:

modify means for receiving numerical values from the memory and returning numerical values to the memory, said modify means having at least a first state in which the numerical value received from the memory is modified in a predetermined fashion before returning the numerical value to the memory and a second state in which the numerical value received from the memory is not modified in said predetermined fashion before returning the numerical value to the memory, and characterizing means for examining at least some of the numerical values and calculating at least one number that defines a property of the examined numerical values, said characterizing means being connected to the modify means for placing the modify means in the first state or the second state depending on the value of said number, the characterizing means comprising:

means for counting the number of numerical values that bear a predetermined relationship to a first value and for counting the number of numerical values that bear a predetermined relationship to a second value, and means for comparing the number of numerical values that bear said predetermined relationship to said first value with the number of numerical values that bear said predetermined relationship to said second value.

2. A method of operating apparatus for receiving data representing events defined by respective pairs of values of first and second variable, said method comprising:

(a) storing numerical values representative of the number of occurrences of each event, (b) examining at least some of the stored numerical values and calculating at least one number that defines a property of the examined numerical values, the examination comprising comparing the number of numerical values exceeding a first value with the number of numerical values exceeding a second value, (c) modifying the stored numerical values in a fashion that depends on the calculated number, the modification comprising decrementing each numerical value employing an operating number of which the value depends on the result of the comparison, and (d) employing the modified numerical values to provide a graphic display of the function that relates the first and second variables.

3. A method of operating apparatus for receiving data representing events defined by respective pairs of values of first and second variable, the numerical values are stored in a finite address space, and each pair of values of the first and second variables defines a memory location within the finite address space, said method comprising:

(a) storing numerical values representative of the number of occurrences of each event, (b) examining at least some of the stored numerical values and calculating at least one number that defines a property of the examined numerical values, the examination comprising comparing the number of numerical values exceeding a first value with the number of numerical values exceeding a second value, (c) modifying the stored numerical values in a fashion that depends on the calculated number, (d) employing the modified numerical values to provide a graphic display of the function that relates the first and second variables (e) acquiring data representative of the occurrence of a subsequent event, (f) identifying the location within the finite address space that represents said event, and (g) incrementing the numerical value stored at said location employing an operating number of which the value depends on the result of the comparison.

* * * * *